(12) United States Patent
Zhang et al.

(10) Patent No.: US 11,133,407 B2
(45) Date of Patent: Sep. 28, 2021

(54) SUPER-JUNCTION IGBT DEVICE AND METHOD FOR MANUFACTURING SAME

(71) Applicant: SHANGHAI HUAHONG GRACE SEMICONDUCTOR MANUFACTURING CORPORATION, Shanghai (CN)

(72) Inventors: Xukun Zhang, Shanghai (CN); Junjun Xing, Shanghai (CN); Jia Pan, Shanghai (CN); Hao Li, Shanghai (CN); Yi Lu, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 61 days.

(21) Appl. No.: 16/599,741

(22) Filed: Oct. 11, 2019

(65) Prior Publication Data

US 2020/0235230 A1 Jul. 23, 2020

(30) Foreign Application Priority Data

Jan. 22, 2019 (CN) .......................... 201910056352.1

(51) Int. Cl.
*H01L 21/8228* (2006.01)
*H01L 29/66* (2006.01)
(Continued)

(52) U.S. Cl.
CPC ...... *H01L 29/7397* (2013.01); *H01L 29/0634* (2013.01); *H01L 29/41708* (2013.01);
(Continued)

(58) Field of Classification Search
CPC .................. H01L 29/4236; H01L 29/7397
(Continued)

(56) References Cited

U.S. PATENT DOCUMENTS 8,735,249 B2 * 5/2014 Tsai ..................... H01L 29/0882
438/270
8,772,868 B2 * 7/2014 Yedinak ............ H01L 29/66734
257/341
(Continued)

FOREIGN PATENT DOCUMENTS

CN 108767000 A 11/2018

OTHER PUBLICATIONS

Search Report in Office Action issued in corresponding Chinese Patent Application No. 2019100563521, dated Dec. 24, 2020.

*Primary Examiner* — Calvin Lee
(74) *Attorney, Agent, or Firm* — MKG, LLC

(57) ABSTRACT

A super-junction IGBT device comprises a plurality of N-type pillars and a plurality of P-type pillars which are alternately arrayed in a horizontal direction. Device cell structures are formed at tops of super-junction cells and each comprise a trench gate having a gate trench striding across an interface of the corresponding P-type pillar and the corresponding N-type pillar. A body region is formed at a top of the corresponding N-type pillar, and a source region is formed on a surface of the body region. The top of each N-type pillar is provided with one body region and two trench gates located on two sides of the body region, and each body region is isolated from the P-type pillars on the two sides of the body region through the corresponding trench gates. The invention further discloses a method for manufacturing a super-junction IGBT device. Self-isolation of the P-type pillars is realized, the on-state current capacity of the device is improved, and the on-state voltage drop of the device is reduced.

15 Claims, 9 Drawing Sheets

(51) Int. Cl.
*H01L 29/739* (2006.01)
*H01L 29/06* (2006.01)
*H01L 29/417* (2006.01)
*H01L 29/423* (2006.01)

(52) U.S. Cl.
CPC ...... *H01L 29/4236* (2013.01); *H01L 29/6634* (2013.01); *H01L 29/66348* (2013.01)

(58) Field of Classification Search
USPC ............... 257/197, 378, 575; 438/325, 327
See application file for complete search history.

(56) References Cited

U.S. PATENT DOCUMENTS

| | | | | |
|---|---|---|---|---|
| 8,907,421 B2* | 12/2014 | Xiao | ............... | H01L 29/7813 257/341 |
| 2013/0093053 A1* | 4/2013 | Toyoda | ............ | H01L 27/0629 257/535 |
| 2014/0077256 A1 | 3/2014 | Hikasa | | |
| 2017/0018642 A1 | 1/2017 | Kagata et al. | | |

\* cited by examiner

SUPER-JUNCTION IGBT DEVICE AND METHOD FOR MANUFACTURING SAME

CROSS REFERENCE TO RELATED APPLICATION

The present application claims priority to Chinese Patent Application No. 201910056352.1 filed on Jan. 22, 2019, the entirety of which is incorporated by reference herein.

TECHNICAL FIELD

The invention relates to a semiconductor integrated circuit, in particular to a super-junction insulated gate bipolar transistor (IGBT) device and a method for manufacturing the super-junction IGBT device.

BACKGROUND OF THE INVENTION

As a voltage-controlled bipolar MOS compound device, IGBT has the major advantages of high input impedance, small input driving power, small on-resistance, high current capacity and high switching speed of bipolar junction power transistors and power MOSFETs and has become one of the important switch elements used for energy control and conversion of power electronic systems, and the performance of the IGBT has a direct influence on the conversion efficiency, size and weight of the power electronic systems.

FIG. 1 is a structural view of an existing super-junction IGBT device. As shown in FIG. 1, the existing super-junction IGBT device comprises:

a super-junction structure, wherein the super-junction structure is formed by a plurality of N-type pillars 101a and a plurality of P-type pillars 102a which are alternately arrayed in the horizontal direction, and each N-type pillar 101a and the adjacent P-type pillar 102a form a corresponding super-junction cell.

The super-junction structure is formed in an N-type epitaxial layer 101, and a P-type doped collector region 103 is formed at the bottom of the N-type epitaxial layer 101. As the N-type pillars 101a are formed by the N-type epitaxial layer 101 between the adjacent P-type pillars 102a, the N-type pillars and the N-type epitaxial layer are all represented by reference sign 101.

The bottoms of the P-type pillars 102a are spaced from the top surface of the collector region 103.

Device cell structures of the super-junction IGBT device are formed at the tops of the super-junction cells, and the multiple device cell structures are connected in parallel to form the super-junction IGBT device.

Each device cell structure comprises:

a trench gate, wherein the trench gate comprises a gate trench, a gate dielectric layer 105 is formed on the bottom surface and side faces of the gate trench, and the gate trench is filled with a polysilicon gate 106; generally, the gate dielectric layer 105 is a gate oxide; and in the prior art, the trench gate is located at the top of the corresponding N-type pillar 101.

A P-type doped body region 107 is formed at the top of the corresponding N-type pillar 101a and extends into the corresponding P-type pillar 102a, wherein the depth of the gate trench is greater than that of the body region 107, and channels are formed in a surface, covered by side faces of the polysilicon gate 106, of the body region 107; and as can be seen from FIG. 1, one channel is formed in each of the two side faces of the polysilicon gate 106.

A source region 108 is formed on the surface of the body region 107 by an N+ region, and the source region 108 is also called an emitter region.

A drift region is formed by the N-type pillar 101a at the bottom of the body region 107 and the N-type epitaxial layer 101 at the bottom of the N-type pillar 101a.

An N-type doped field stop layer 104 is formed in the N-type epitaxial layer 101 located on the front of the collector region 103, wherein the doping concentration of the field stop layer 104 is greater than that of the N-type epitaxial layer 101, and the top surface of the field stop layer 104 is spaced from bottom surface of the corresponding P-type pillar 102a.

The surfaces of the source region 108, the polysilicon gate 106 and the body region 107 are covered with an interlayer film 109.

Contact holes 111 penetrating through the interlayer film 109 are separately formed in the top of the source region 108 and in the top of the polysilicon gate 106.

A front metal layer 112 is formed on the surface of the interlayer film 109 and is patterned to form an emitter and a gate, wherein the emitter makes contact with the source region 108 at the bottom of the emitter via the corresponding contact hole 111, and the gate makes contact with the polysilicon gate 106 at the bottom of the gate via the corresponding contact hole 111.

A collector is formed on the bottom surface of the collector region 103 by a back metal layer 113.

Generally, the bottom of the contact hole 111 corresponding to the emitter penetrates through the source region 108, a body lead-out region 110 is formed by a P+ region on the surface of the body region 107 located at the bottom of the contact hole 111 corresponding to the emitter, and the emitter is connected with the body region 107 through the body lead-out region 110.

Generally, the P-type pillars 102a are formed by a P-type epitaxial layer 102 filled in super-junction trenches 201 which are formed in the N-type epitaxial layer 101, and the N-type pillars 101a are formed by the N-type epitaxial layer 101 located between the P-type pillars 102a. Or, the P-type pillars 102a are formed by a P-type ion-implanted region formed in a selected area of the N-type epitaxial layer 101, particularly, the N-type epitaxial layer 101 corresponding to the super-junction structure is formed by multiple times of epitaxial growth, and P-type ion implantation is conducted every time the N-type epitaxial layer epitaxially grows, so as to form one part of the P-type ion-implanted region corresponding to the P-type pillars 102a.

According to the structure in FIG. 1, the P-type doped body region 107 is formed at the top of the corresponding N-type pillar 101a and stretches into the corresponding P-type pillar 102a, which means that the body region 107 makes contact with the P-type pillar 102. By adoption of such structure, when the IGBT device is turned on, holes injected into the drift region from the collector region 103 on the back may leak into the source region 108 via the body region 107 and the P-type pillar 102a in contact with the body region 107 and cannot be stored in the drift region, thus, affecting the decrease of the on-state voltage drop of the IGBT device.

On the basis of the structure in FIG. 1, the body region 107 has to be isolated from the corresponding P-type pillar 102a by an N-type epitaxial layer epitaxially grown at the top of the super-junction structure, so as to decrease the on-state voltage drop, in the prior art; and the body region 107 is formed in the N-type epitaxial layer at the top of the super-junction structure, and the bottom of the body region 107 is isolated from the top of the corresponding P-type pillar 102a by the N-type epitaxial layer having a certain thickness, so that the body region 107 is isolated from the P-type pillar 102a through the N-type epitaxial layer. Due to the fact that the body region 107 isolated from the corresponding P-type pillar by the extra epitaxial layer, costs are high.

To comply with the development tendency of power electronic devices towards higher current density, smaller on-state voltage drop and lower turn-off loss, it becomes very important to increase the current density and to decrease the on-state voltage drop (Vcesat) of IGBT devices.

BRIEF SUMMARY OF THE INVENTION

The technical issue to be settled by the invention is to provide a super-junction IGBT device capable of realizing self-isolation of P-type pillars and reducing costs and having a higher on-state current capacity and a lower on-state voltage drop. Correspondingly, the invention further provides a method for manufacturing the super-junction IGBT device.

To settle the above technical issue, the invention provides a super-junction IGBT device. The super-junction IGBT device comprises:

a super-junction structure, wherein the super-junction structure is formed by a plurality of N-type pillars and a plurality of P-type pillars which are alternately arrayed in the horizontal direction, and each N-type pillar and the adjacent P-type pillar form a corresponding super-junction cell.

The super-junction structure is formed in an N-type epitaxial layer, and a P-type doped collector region is formed at the bottom of the N-type epitaxial layer.

The bottoms of the P-type pillars are spaced from the top surface of the collector region.

Device cell structures of the super-junction IGBT device are formed at the tops of the super-junction cells, and the multiple device cell structures are connected in parallel to form the super-junction IGBT device.

Each device cell structure comprises:

a trench gate, wherein the trench gate comprises a gate trench, a gate dielectric layer is formed on the bottom surface and side faces of the gate trench, and the gate trench is filled with a polysilicon gate.

The gate trench strides across an interface of the corresponding P-type pillar and the corresponding N-type pillar in the horizontal direction, a first side face of gate trench is located in the corresponding P-type pillar, and a second side face of the gate trench is located in the corresponding N-type pillar.

A P-type doped body region is formed at the top of the corresponding N-type pillar, wherein the depth of the gate trench is greater than that of the body region, and channels are formed in a surface, covered by side faces of the polysilicon gate, of the body region.

A source region is formed on the surface of the body region by an N+ region.

A drift region is formed by the N-type pillar at the bottom of the body region and the N-type epitaxial layer at the bottom of the N-type pillar.

The top of each N-type pillar is provided with one body region and two gate trenches located on two sides of the body region, and each body region is isolated from the P-type pillars on two sides of the body region by the corresponding gate trenches, so that the on-state current capacity of the super-junction IGBT device is improved, and the on-state voltage drop of the super-junction IGBT device is decreased.

Furthermore, an N-type doped field stop layer is formed in the N-type epitaxial layer located on the front of the collector region, wherein the doping concentration of the field stop layer is greater than that of the N-type epitaxial layer, and the top surface of the field stop layer is spaced from the bottom surface of the corresponding P-type pillar.

Furthermore, the gate dielectric layer is a gate oxide.

Furthermore, the surfaces of the source region, the polysilicon gate and the body region are covered with an interlayer film.

Furthermore, contact holes penetrating through the interlayer film are separately formed in the top of the source region and in the top of the polysilicon gate.

A front metal layer is formed on the surface of the interlayer film and is patterned to form an emitter and a gate, wherein the emitter makes contact with the source region at the bottom of the emitter via the corresponding contact hole, and the gate makes contact with the polysilicon gate at the bottom of the gate via the corresponding contact hole.

A collector is formed on the bottom surface of the collector region by a back metal layer.

Furthermore, the bottom of the contact hole corresponding to the emitter penetrates through the source region, a body lead-out region is formed by a P+ region on the surface of the body region located at the bottom of the contact hole corresponding to the emitter, and the emitter is connected with the body region through the body lead-out region.

Furthermore, the P-type pillars are formed by a P-type epitaxial layer filled in super-junction trenches which are formed in the N-type epitaxial layer, and the N-type pillars are formed by the N-type epitaxial layer between the P-type pillars.

Furthermore, the P-type pillars are formed by a P-type ion-implanted region formed in a selected area of the N-type epitaxial layer, particularly, the N-type epitaxial layer corresponding to the super-junction structure is formed by multiple times of epitaxial growth, and P-type ion implantation is conducted every time the N-type epitaxial layer epitaxially grows, so as to form one part of the P-type ion-implanted region corresponding to the P-type pillars.

Furthermore, the N-type pillars are formed by the N-type epitaxial layer between the P-type pillars.

To settle the above technical issue, the invention further provides a method for manufacturing a super-junction IGBT device. The method comprises the following front process steps:

Step 1, forming a super-junction structure in an N-type epitaxial layer, wherein the super-junction structure is formed by a plurality of N-type pillars and a plurality of P-type pillars which are alternately arrayed in the horizontal direction, and each N-type pillar and the adjacent P-type pillar form a corresponding super-junction cell.

Step 2, forming trench gates of device cell structures of the super-junction IGBT device, wherein the device cell structures are formed at the tops of the super-junction cells, and the multiple device cell structures are connected in parallel to form the super-junction IGBT device. Each trench gate is formed through the following sub-steps:

Step 21, forming a gate trench, wherein the gate trench strides across an interface of the corresponding P-type pillar and the corresponding N-type pillar in the horizontal direction, a first side face of the gate trench is located in the corresponding P-type pillar, and a second side face of the gate trench is located in the corresponding N-type pillar 1;

Step 22, forming a gate dielectric layer on the bottom surface and side faces of the gate trench; and Step 23, filling the gate trench formed with the gate dielectric layer with polysilicon, so that a polysilicon gate is formed.

Step 3, forming a P-type doped body region, wherein the body region is located at the top of the corresponding N-type pillar, the depth of the gate trench is greater than that of the body region, and channels are formed in a surface, covered by side faces of the polysilicon gates, of the body region;

A drift region is formed by the N-type pillar at the bottom of the body region and the N-type epitaxial layer at the bottom of the N-type pillar;

The top of each N-type pillar is provided with one body region and two trench gates located on two sides of the body region, and each body region is isolated from the P-type pillars on two sides of the body region by the corresponding trench gates, so that the on-state current capacity of the super-junction IGBT device is improved, and the on-state voltage drop of the super-junction IGBT device is decreased.

Step 4, forming a source region on the surface of the body region by an N+ region.

The method further comprises the following back process step to be executed after the front process step:

Forming a P-type doped collector region at the bottom of the N-type epitaxial layer, wherein the bottoms of the P-type pillars are spaced from the top surface of the collector region.

Furthermore, the method further comprises the following back process step:

Forming an N-type doped field stop layer in the N-type epitaxial layer located on the front of the collector region, wherein the doping concentration of the field stop layer is greater than that of the N-type epitaxial layer, and the top surface of the field stop layer is spaced from the bottom surface of the corresponding P-type pillar.

Furthermore, the dielectric layer in Step 22 is a gate oxide and is formed by thermal oxidation.

Furthermore, the method further comprises the following front process steps:

Step 5, forming an interlayer film to cover the surfaces of the source region, the polysilicon gate and the body region;

Step 6, forming contact holes penetrating through the interlayer film in the top of the source region and in the top of the polysilicon gate;

Step 7, forming a front metal layer on the surface of the interlayer film and patterning the front metal layer to form an emitter and a gate, wherein the emitter makes contact with the source region at the bottom of the emitter via the corresponding contact hole, and the gate makes contact with the polysilicon gate at the bottom of the gate via the corresponding contact hole.

The method further comprises the following back process step:

Forming a back metal layer on the bottom surface of the collector region, and forming a collector by the back metal layer.

Furthermore, in Step 6, the bottom of the contact hole corresponding to the emitter penetrates through the source region; before an opening of the contact hole corresponding to the emitter is filled with metal, a body lead-out region is formed by a P+ region on the surface of the body region located at the bottom of the contact hole corresponding to the emitter; and the emitter is connected with the body region through the body lead-out region.

Furthermore, the super-junction structure is formed in Step 1 through the following sub-steps:

Forming a plurality of super-junction trenches in the N-type epitaxial layer by photo-etching definition and etching; and Filling the super-junction trenches with a P-type epitaxial layer, so that the P-type pillars are formed, and the N-type pillars are formed by the N-type epitaxial layer between the P-type pillars.

Furthermore, the super-junction structure is formed in Step 1 through the following sub-steps:

Providing a first N-type epitaxial sub-layer, and forming first P-type sub-pillars in selected areas of the first N-type epitaxial sub-layer by photo-etching definition and ion implantation;

Forming a second N-type epitaxial sub-layer on the surface of the first N-type epitaxial sub-layer by epitaxial growth, forming second P-type sub-pillars in selected areas of the second N-type epitaxial sub-layer by photo-etching definition and ion implantation, and superimposing the second P-type sub-pillars and the first P-type sub-pillars; and Repeating epitaxial growth of the second N-type epitaxial sub-layer and photo-etching definition and ion implantation of the second P-type sub-pillars, so that more N-type epitaxial sub-layers are superimposed, and more corresponding P-type sub-pillars are superimposed, the N-type epitaxial layer is formed by the superimposed N-type epitaxial sub-layers, the corresponding P-type pillars are formed by the superimposed P-type sub-pillars in the N-type epitaxial sub-layers, and the N-type pillars are formed by the N-type epitaxial layer between the P-type pillars.

Furthermore, the N-type epitaxial layer is formed on the surface of a semiconductor substrate. The collector region is formed through the following sub-steps:

Thinning the back of the semiconductor substrate; and

Conducting ion implantation on the back of the thinned semiconductor substrate, so that the collector region is formed.

The gate structure (namely the trench gate) of each device cell structure in the invention is specifically configured in such a manner: the gate trench of the trench gate strides across the interface of the corresponding P-type pillar and the corresponding N-type pillar in the horizontal direction, and the gate trench penetrates through the body region formed at the top of the corresponding N-type pillar in the longitudinal direction, so that the body region is self-isolated from the P-type pillars on two sides of the body region by the trench gate, an extra isolation structure epitaxially grown at the tops of the P-type pillars to isolate the body regions from the P-type pillars is replaced by the self-isolation structure of the P-type pillars, the body regions can be isolated from the P-type pillars by corresponding changes to the layout of the trench gates, and thus, costs are reduced. In the invention, the P-type pillars are isolated from the body regions, so that the on-state current capacity of the device is improved, and the on-state voltage drop of the device is reduced.

BRIEF DESCRIPTION OF THE DRAWINGS

The invention is further expounded below with reference to accompanying drawings and specific embodiments.

DETAILED DESCRIPTION OF PREFERRED EMBODIMENTS OF THE INVENTION

Figure 2:
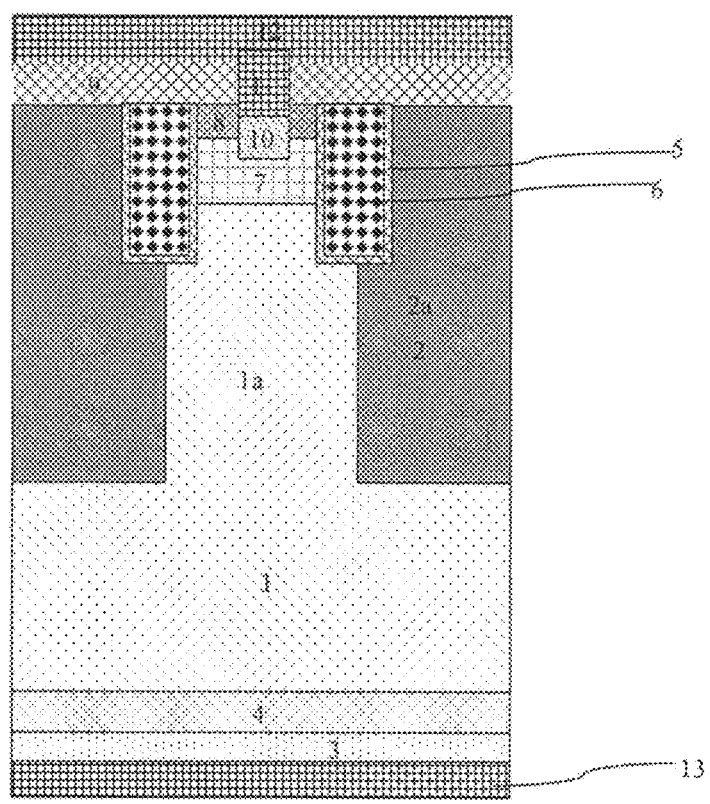
FIG. 2 is a structural view of a super-junction IGBT device in an embodiment of the invention.

FIG. 2 is a structural view of the super-junction IGBT device in an embodiment of the invention. As shown in FIG. 2, the super-junction IGBT device in this embodiment comprises:

a super-junction structure, wherein the super-junction structure is formed by a plurality of N-type pillars 1a and a plurality of P-type pillars 2a which are alternately arrayed in the horizontal direction, and each N-type pillar 1a and the adjacent P-type pillar 2a form a corresponding super-junction cell.

The super-junction structure is formed in an N-type epitaxial layer 1, and a P-type doped collector region 3 is formed at the bottom of the N-type epitaxial layer 1.

In this embodiment, the N-type pillars 1a are formed the N-type epitaxial layer 1 between the adjacent P-type pillars 2a, and thus, the N-type pillars and the N-type epitaxial layer may be represented by reference sign 1. Preferably, the N-type epitaxial layer 1 is a silicon epitaxial layer and is formed on the surface of a silicon substrate. The collector region 3 is formed by ion implantation conducted on the back of the silicon substrate after the back of the silicon substrate is thinned.

The bottoms of the P-type pillars 2a are spaced from the top surface of the collector region 3.

Device cell structures of the super-junction IGBT device are formed at the tops of the super-junction cells, and the multiple device cell structures are connected in parallel to form the super-junction IGBT device.

Each device cell structure comprises:

a trench gate, wherein the trench gate comprises a gate trench 202 (shown in FIG. 5C), a gate dielectric layer 5 is formed on the bottom surface and side faces of the gate trench 202, and the gate trench 202 is filled with a polysilicon gate 6. Preferably, the gate dielectric layer 5 is a gate oxide.

The gate trench 202 strides across an interface of the corresponding P-type pillar 2 and the corresponding N-type pillar in the horizontal direction, a first side face of gate trench 202 is located in the corresponding P-type pillar 2a, and a second side face of the gate trench 202 is located in the corresponding N-type pillar 1a.

A P-type doped body region 7 is formed at the top of the corresponding N-type pillar 1a, wherein the depth of the gate trench 202 is greater than that of the body region 7, and channels are formed in a surface, covered by side faces of the polysilicon gate 6, of the body region 7.

A source region 8 is formed on the surface of the body region 7 by an N+ region, and the source region 8 is also called an emitter region.

A drift region is formed by the N-type pillar 1a at the bottom of the body region 7 and the N-type epitaxial layer 1 at the bottom of the N-type pillar 1a.

The top of each N-type pillar 1a is provided with one body region 7 and two gate trenches located on two sides of the body region 7, and each body region 7 is isolated from the P-type pillars 2a on two sides of the body region 7 by the corresponding gate trenches, so that the on-state voltage drop of the super-junction IGBT device is decreased.

An N-type doped field stop layer 4 is formed in the N-type epitaxial layer 1 located on the front of the collector region 3, wherein the doping concentration of the field stop layer 4 is greater than that of the N-type epitaxial layer 1, and the top surface of the field stop layer 4 is spaced from the bottom surface of the corresponding P-type pillar 2a.

The surfaces of the source region 8, the polysilicon gate 6 and the body region 7 are covered with an interlayer film 9.

Contact holes 11 penetrating through the interlayer film 9 are separately formed in the top of the source region 8 and in the top of the polysilicon gate 6.

A front metal layer 12 is formed on the surface of the interlayer film 9 and is patterned to form an emitter and a gate, wherein the emitter makes contact with the source region 8 at the bottom of the emitter via the corresponding contact hole 11, and the gate makes contact with the polysilicon gate 6 at the bottom of the gate via the corresponding contact hole 11.

A collector is formed on the bottom surface of the collector region 3 by a back metal layer 13.

In this embodiment, the bottom of the contact hole 11 corresponding to the emitter penetrates through the source region 8, a body lead-out region 10 is formed by a P+ region on the surface of the body region 7 located at the bottom of the contact hole 11 corresponding to the emitter, and the emitter is connected with the body region 7 through the body lead-out region 10.

In this embodiment, the P-type pillars 2a are formed by a P-type epitaxial layer filled in super-junction trenches 201 which are formed in the N-type epitaxial layer 1, and the N-type pillars 1a are formed by the N-type epitaxial layer 1 between the P-type pillars 2a. Or, in other embodiments, the P-type pillars 2a are formed by a P-type ion-implanted region formed in a selected area of the N-type epitaxial layer 1, particularly, the N-type epitaxial layer 1 corresponding to the super-junction structure is formed by multiple times of epitaxial growth, and P-type ion implantation is conducted every time the N-type epitaxial layer 1 epitaxially grows, so as to form one part of the P-type ion-implanted region corresponding to the P-type pillars 2a.

In this embodiment, the gate structure (namely the trench gate) of each device cell structure is specifically configured in such a manner: the gate trench 202 of the trench gate strides across the interface of the corresponding P-type pillar 2a and the corresponding N-type pillar 1a in the horizontal direction, and the gate trench 202 penetrates through the body region 7 formed at the top of the corresponding N-type pillar 1a in the longitudinal direction, so that the body region 7 is self-isolated from the P-type pillars 2a on two sides of the body region 7 by the trench gate, an extra isolation structure epitaxially grown at the tops of the P-type pillars 2a to isolate the body regions 7 from the P-type pillars 2a is replaced by the self-isolation structure of the P-type pillars 2a, the body regions 7 can be isolated from the P-type pillars 2a by corresponding changes to the layout of the trench gates, and thus, costs are reduced. In this embodiment, the P-type pillars 2a are isolated from the body regions 7, so that the on-state current capacity of the device is improved, and the on-state voltage of the device is reduced.

Figure 1:
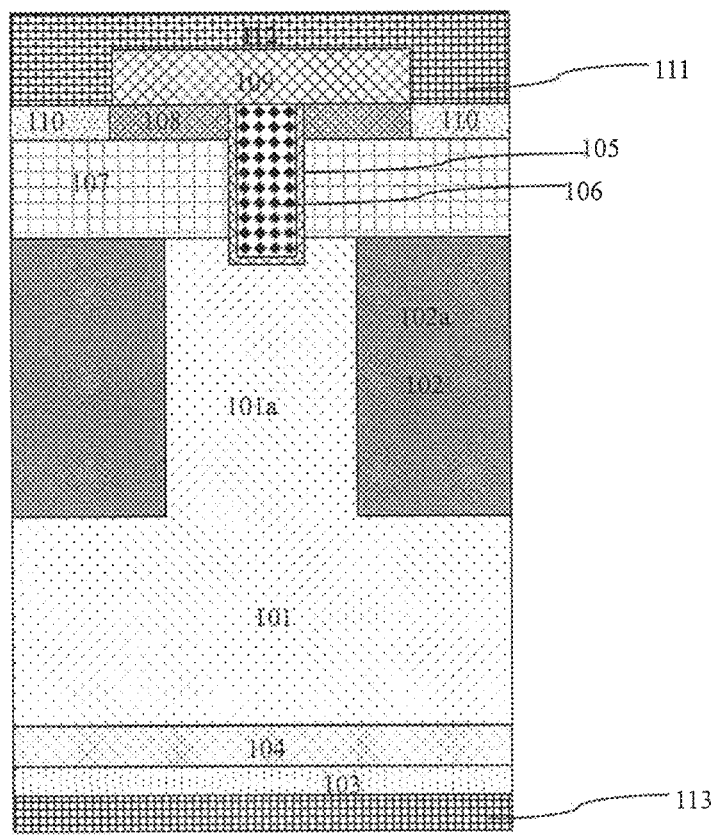
FIG. 1 is a structural view of an existing super-junction IGBT device.
Figure 3A:
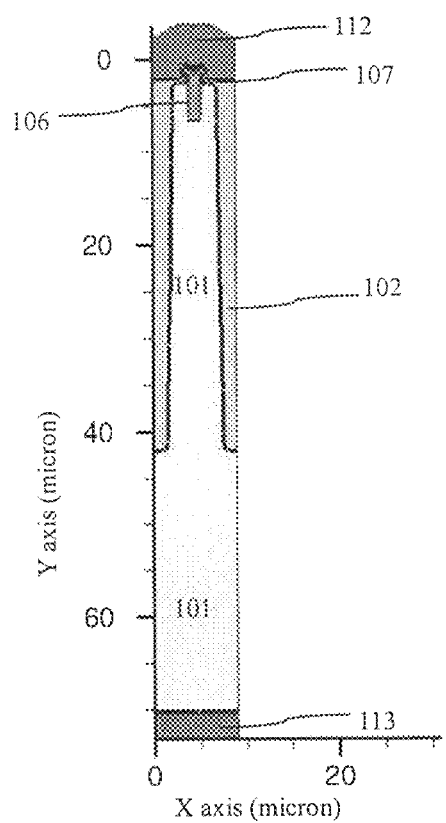
FIG. 3A is a structural simulation diagram of the existing super-junction IGBT device.

FIG. 3A is a structure simulation diagram of the existing super-junction IGBT device, wherein identical reference signals in FIG. 3A and FIG. 1 represent identical components. FIG. 3A also shows the dimension relation of the device, wherein X axis refers to the lateral dimension of the device, and Y axis refers to the longitudinal dimension of the device.

Figure 3B:
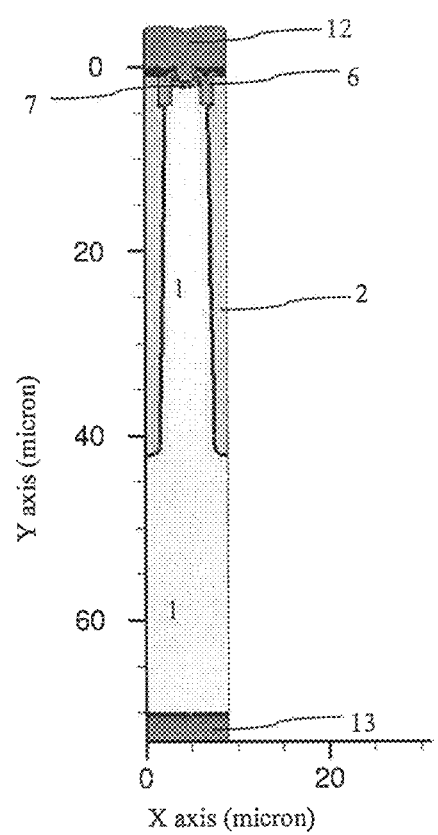
FIG. 3B is a structure simulation diagram of the super-junction IGBT device in the embodiment of the invention.

FIG. 3B is a structure simulation diagram of the super-junction IGBT device in this embodiment of the invention, wherein identical reference signs in FIG. 3B and FIG. 2 represent identical components.

Figure 4:
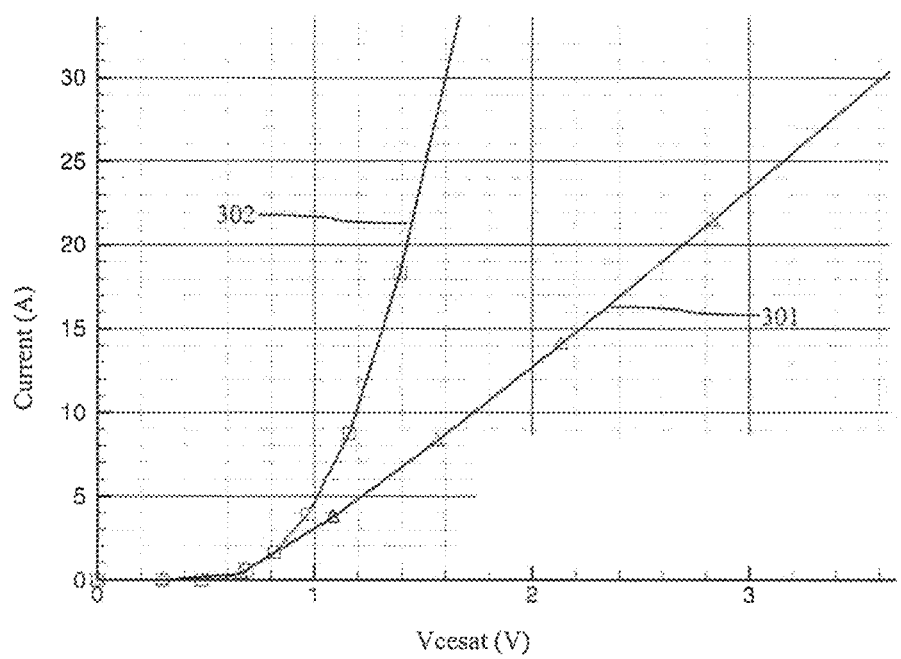
FIG. 4 is a comparison diagram of on-current and Vcesat curves the super-junction IGBT device in the embodiment of the invention and the existing super-junction IGBT device.

FIG. 4 is a comparison diagram of on-current and Vcesat curves of the super-junction IGBT device in this embodiment and the existing super-junction IGBT device, wherein curve 301 is an on-current and Vcesat curve of the existing super-junction IGBT device in FIG. 1, curve 302 is an on-current and Vcesat curve of the super-junction IGBT device in this embodiment of the invention in FIG. 2, and curve 301 and curve 302 are obtained by simulation. As can be seen from curve 301 and curve 302, under the same Vcesat, the on-current of the super-junction IGBT device in this embodiment is increased; and under the same on-current, Vcesat of the super-junction IGBT device in this embodiment is decreased.

FIGS. 5A-5H are structural views of the device in all steps of a method for manufacturing the super-junction IGBT device in this embodiment of the invention. The method for manufacturing the super-junction IGBT device in this embodiment of the invention comprises the following front process steps:

Step 1, a super-junction structure is formed in an N-type epitaxial layer 1, wherein the super-junction structure is formed by a plurality of N-type pillars 1a and a plurality of P-type pillars 2a which are alternately arrayed in the horizontal direction, and each N-type pillar 1a and the adjacent P-type pillar 2a form a corresponding super-junction cell.

Figure 5A:
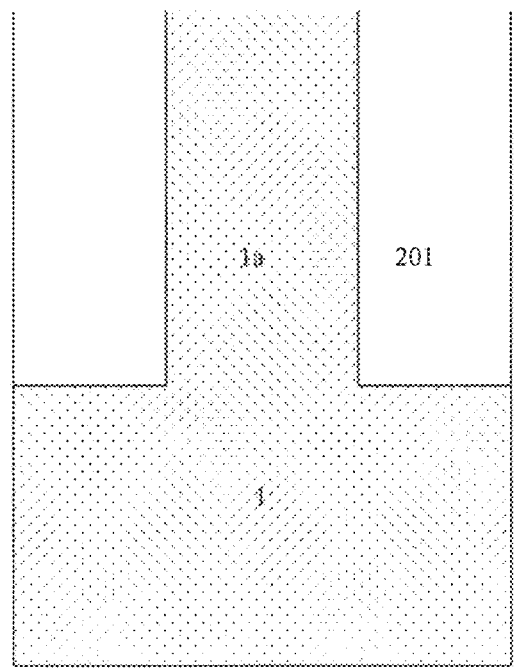
FIG. 5A-5H are structural views of the device in all steps of a method for manufacturing the super-junction IGBT device in the embodiment of the invention.
Figure 5B:
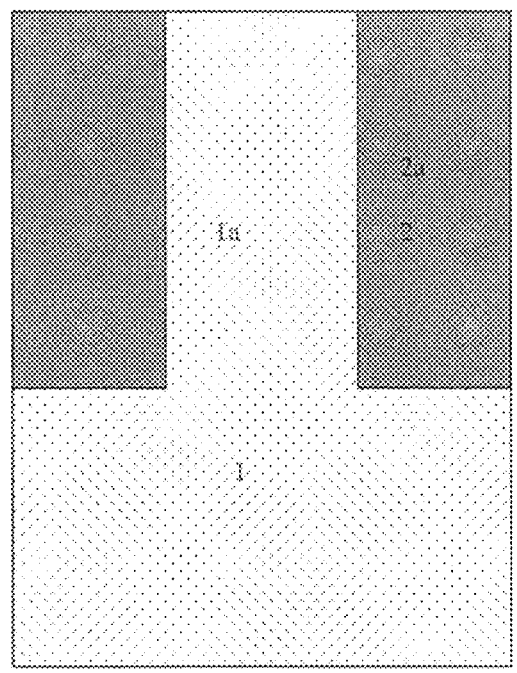

In this embodiment of the method, the super-junction structure is formed in Step 1 through the following sub-steps:

As shown in FIG. 5A, a plurality of super-junction trenches 201 are formed in the N-type epitaxial layer 1 by photo-etching definition and etching;

As shown in FIG. 5B, the super-junction trenches 201 are filled with a P-type epitaxial layer, so that the P-type pillars 2a are formed, and the N-type pillars 1a are formed by the N-type epitaxial layer 1 between the P-type pillars 2a.

Or, in other embodiments, the super-junction structure is formed in Step 1 through the following sub-steps:

A first N-type epitaxial sub-layer is provided, and first P-type sub-pillars are formed in selected areas of the first N-type epitaxial sub-layer by photo-etching definition and ion implantation;

A second N-type epitaxial sub-layer is formed on the surface of the first N-type epitaxial sub-layer by epitaxial growth, second P-type sub-pillars are formed in selected areas of the second N-type epitaxial sub-layer by photo-etching definition and ion implantation, and the second P-type sub-pillars and the first P-type sub-pillars are superimposed; and Epitaxial growth of the second N-type epitaxial sub-layer and photo-etching definition and ion implantation of the second P-type sub-pillars are repeated, so that more N-type epitaxial sub-layers are superimposed, and more corresponding P-type sub-pillars are superimposed; the N-type epitaxial layer 1 is formed by the superimposed N-type epitaxial sub-layers, the corresponding P-type pillars 2a are formed by the superimposed P-type sub-pillars in the N-type epitaxial sub-layers, and the N-type pillars 1a are formed by the N-type epitaxial layer 1 between the P-type pillars 2a.

Preferably, the N-type epitaxial layer 1 is a silicon epitaxial layer and is formed on the surface of a silicon substrate.

Figure 5C:
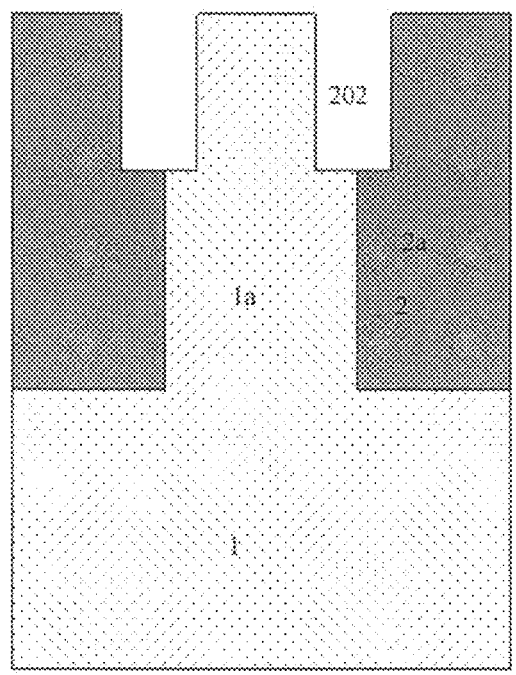
Figure 5D:
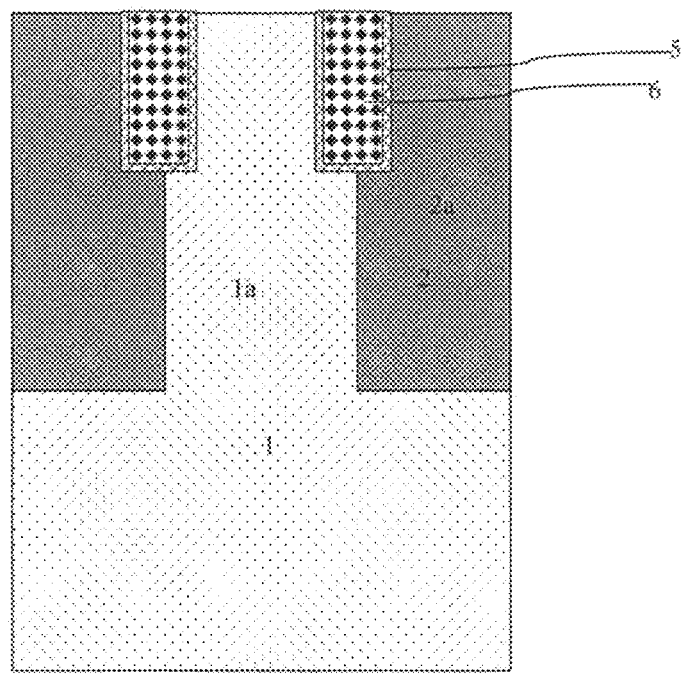

Step 2, trench gates of device cell structures of the super-junction IGBT device are formed, wherein the device cell structures are formed at the tops of the super-junction cells, and the multiple device cell structures are connected in parallel to form the super-junction IGBT device. Each trench gate is formed through the following sub-steps:

Step 21, as shown in FIG. 5C, a gate trench 202 is formed and strides across an interface of the corresponding P-type pillar 2a and the corresponding N-type pillar 1a in the horizontal direction, a first side face of the gate trench 202 is located in the corresponding P-type pillar 2a, and a second side face of the gate trench 202 is located in the corresponding N-type pillar 1a;

Step 22, as shown in FIG. 5D, a gate dielectric layer 5 is formed on the bottom surface and side faces of the gate trench 202, wherein the gate dielectric layer 5 is preferably a gate oxide and is formed by thermal oxidation; and Step 23, as shown in FIG. 5D, the gate trench 202 formed with the gate dielectric layer 5 is filled with polysilicon, so that a polysilicon gate 6 is formed.

Figure 5E:
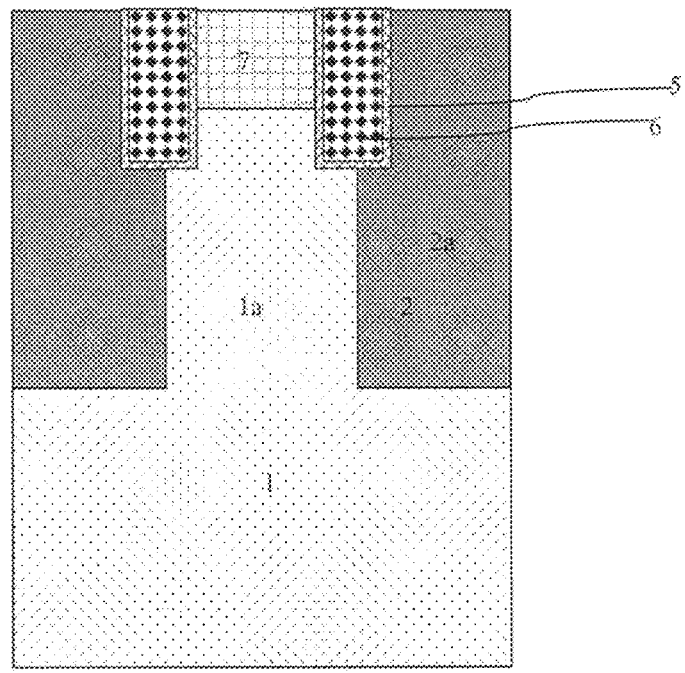

Step 3, as shown in FIG. 5E, a P-type doped body region 7 is formed at the top of the corresponding N-type pillar 1a, wherein the depth of the gate trench 202 is greater than that of the body region 7, and channels are formed in a surface, covered by side faces of the polysilicon gates 6, of the body region 7. Generally, the body region 7 is formed by full ion implantation, impurities are also injected into the top of the corresponding P-type pillar 2a to serve as one part of the P-type pillar 2a while being injected into the body region 7 by ion implantation, and the impurities injected into the top of the P-type pillar 2a by ion implantation of the body region 7 have no negative influence on channel formation.

A drift region is formed by the N-type pillar 1a at the bottom of the body region 7 and the N-type epitaxial layer 1 at the bottom of the N-type pillar 1a.

The top of each N-type pillar 1a is provided with one body region 7 and two trench gates located on two sides of the body region 7, and each body region 7 is isolated from the P-type pillars 2a on two sides of the body region 7 by the corresponding trench gates, so that the on-state voltage drop of the super-junction IGBT device is decreased.

Figure 5F:
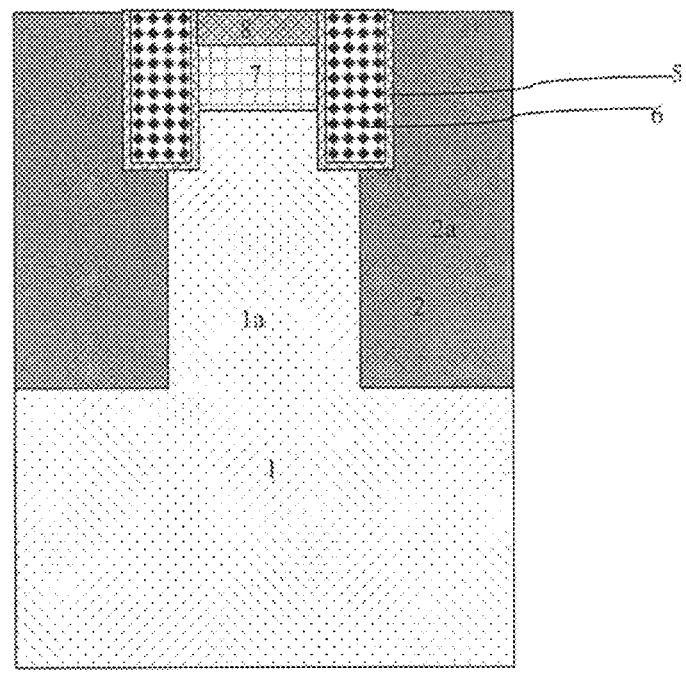

Step 4, as shown in FIG. 5F, a source region 8 is formed on the surface of the body region 7 by an N+ region.

Figure 5G:
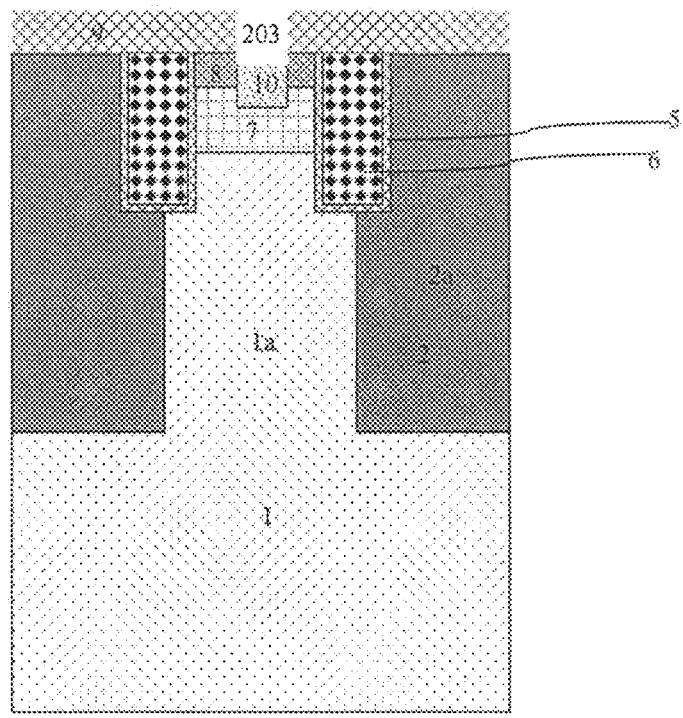

The method further comprises the following front process steps:

Step 5, as shown in FIG. 5G, an interlayer film 9 is formed to cover the surfaces of the source region 8, the polysilicon gate 6 and the body region 7.

Step 6, contact holes 11 penetrating through the interlayer film 9 are formed in the top of the source region 8 and in the top of the polysilicon gate 6.

Figure 5H:
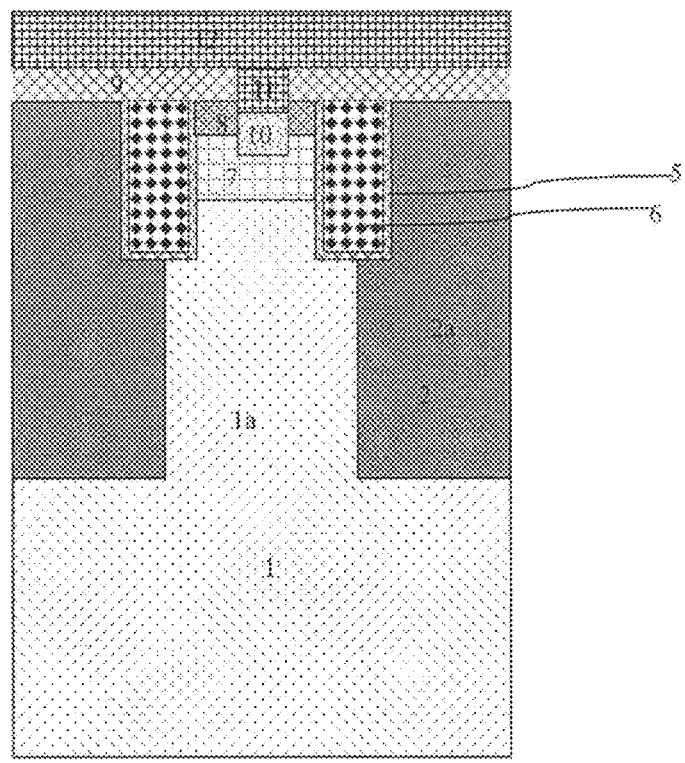

The bottom of the contact hole 11 corresponding to an emitter penetrates through the source region 8. As shown in FIG. 5G, an opening 203 of the contact hole 11 corresponding to the emitter is formed first; before the opening 203 of the contact hole 11 corresponding to the emitter is filled with metal, a body lead-out region 10 is formed by a P+ region on the surface of the body region 7 located at the bottom of the contact hole 11 corresponding to the emitter; the emitter is connected with the body region 7 through the body lead-out region 10;

Afterwards, as shown in FIG. 5H, the opening 203 is filled with metal, so that the contact hole 11 is formed.

Step 7, a front metal layer 12 is formed on the surface of the interlayer film 9 and is patterned to form the emitter and a gate, wherein the emitter makes contact with the source region 8 at the bottom of the emitter via the corresponding contact hole 11, and the gate makes contact with the polysilicon gate 6 at the bottom of the gate via the corresponding contact hole 11.

The method further comprises the following back process steps to be executed after the front process steps:

A P-type doped collector region 3 is formed at the bottom of the N-type epitaxial layer 1, wherein the bottoms of the P-type pillars 2a are spaced from the top surface of the collector region 3. In this embodiment, the N-type epitaxial layer 1 is formed on the surface of a semiconductor substrate. The collector region 3 is formed through the following sub-steps:

The back of the semiconductor substrate is thinned; and

Ion implantation is conducted on the back of the thinned semiconductor substrate, so that the collector region 3 is formed.

An N-type doped field stop layer 4 is formed on the N-type epitaxial layer 1 located on the front of the collector region 3, wherein the doping concentration of the field stop layer 4 is greater than that of the N-type epitaxial layer 1, and the top surface of the field stop layer 4 is spaced from the bottom surface of the corresponding P-type pillar 2a. Generally, the field stop layer 4 and the collector region 3 are formed sequentially by N-type ion implantation, P-type ion implantation and annealing such as laser annealing.

As shown in FIG. 2, a back metal layer 13 is formed on the bottom surface of the collector region 3, and a collector is formed by the back metal layer 13.

The invention is detailed above with reference to specific embodiments, but these specific embodiments are not intended to limit the invention. Various transformations and improvements can be made by those skilled in this field without deviating from the principle of the invention, and all these transformations and improvements should also fall within the protection scope of the invention.

What is claimed is:

1. A method for manufacturing a super-junction insulated gate bipolar transistor (IGBT) device, wherein the method comprises the following front process steps:

Step 1, forming a super-junction structure in an N-type epitaxial layer, wherein the super-junction structure is formed by a plurality of N-type pillars and P-type pillars which are alternately arrayed in a horizontal direction, and each said N-type pillar and the adjacent P-type pillar form a corresponding super-junction cell;

Step 2, forming trench gates of device cell structures of the super-junction IGBT device, wherein the device cell structures are formed at tops of the super-junction cells, and the multiple device cell structures are connected in parallel to form the super-junction IGBT device; and wherein each said trench gate is formed through the following sub-steps:

Step 21, forming a gate trench, wherein the gate trench extends across an interface of the corresponding P-type pillar and adjacent N-type pillar in the horizontal direction, a first side face of the gate trench is located in the corresponding P-type pillar, and a second side face of the gate trench is located in the corresponding adjacent N-type pillar;

Step 22, forming a gate dielectric layer on a bottom surface and side faces of the gate trench; and Step 23, filling the gate trench with polysilicon, so that a polysilicon gate is formed;

Step 3, forming a P-type doped body region, wherein the body region is located at a top of the corresponding N-type pillar, a depth of the gate trench is greater than that of the body region, and channels are formed on a surface of the body region and covered by side faces of the polysilicon gates;

wherein a drift region is formed by the N-type pillar at a bottom of the body region and by the N-type epitaxial layer at a bottom of the N-type pillar; and wherein the top of each N-type pillar is provided with one body region and two gate trenches located on two sides of the body region, and each body region is isolated from the P-type pillars on two sides of the body region by the corresponding gate trenches;

Step 4, forming a source region on a surface of the body region by an N+ region; and the method further comprising the following back process step to be executed after the front process step of forming a P-type doped collector region at a bottom of the N-type epitaxial layer, wherein bottoms of the P-type pillars are spaced from a top surface of the collector region.

2. The method for manufacturing the super-junction IGBT device according to claim 1, wherein the super-junction structure is formed in Step 1 through the following sub-steps:

providing a first N-type epitaxial sub-layer, and forming first P-type sub-pillars in selected areas of the first N-type epitaxial sub-layer by photo-etching definition and ion implantation;

forming a second N-type epitaxial sub-layer on a surface of the first N-type epitaxial sub-layer by epitaxial growth, forming second P-type sub-pillars in selected areas of the second N-type epitaxial sub-layer by photo-etching definition and ion implantation, and superimposing the second P-type sub-pillars and the first P-type sub-pillars; and repeating epitaxial growth of the second N-type epitaxial sub-layer and photo-etching definition and ion implantation of the second P-type sub-pillars, so that more N-type epitaxial sub-layers are superimposed, and more corresponding P-type sub-pillars are superimposed, the N-type epitaxial layer is formed by the superimposed N-type epitaxial sub-layers, the corresponding P-type pillars are formed by the superimposed P-type sub-pillars in the N-type epitaxial sub-layers, and the N-type pillars are formed by the N-type epitaxial layer between the P-type pillars.

3. The method for manufacturing the super-junction IGBT device according to claim 1, wherein the super-junction structure is formed in Step 1 through the following sub-steps:

forming a plurality of super-junction trenches in the N-type epitaxial layer by photo-etching definition and etching; and filling the super-junction trenches with a P-type epitaxial layer, so that the P-type pillars are formed, and the N-type pillars are formed by the N-type epitaxial layer between the P-type pillars.

4. The method for manufacturing the super-junction IGBT device according to claim 1, wherein the method further comprises the following back process step:

forming an N-type doped field stop layer in the N-type epitaxial layer located on a front of the collector region, wherein a doping concentration of the field stop layer is greater than that of the N-type epitaxial layer, and a top surface of the field stop layer is spaced from a bottom surface of the corresponding P-type pillar.

5. The method for manufacturing a super-junction IGBT device according to claim 1, wherein the N-type epitaxial layer is formed on a surface of a semiconductor substrate, and the collector region is formed through the following sub-steps:
thinning a back of the semiconductor substrate; and
conducting ion implantation on the back of the thinned semiconductor substrate, so that the collector region is formed.

6. The method for manufacturing the super-junction IGBT device according to claim 1, wherein the dielectric layer in Step 22 is a gate oxide and is formed by thermal oxidation.

7. The method for manufacturing the super-junction IGBT device according to claim 1, further comprising the following front process steps:
Step 5, forming an interlayer film to cover surfaces of the source region, the polysilicon gate and the body region;
Step 6, forming contact holes penetrating through the interlayer film in a top of the source region and in a top of the polysilicon gate;
Step 7, forming a front metal layer on a surface of the interlayer film and patterning the front metal layer to form an emitter and a gate, wherein the emitter makes contact with the source region at a bottom of the emitter via the corresponding contact hole, and the gate makes contact with the polysilicon gate at a bottom of the gate via the corresponding contact hole; and
wherein the method further comprises the following back process step of forming a back metal layer on a bottom surface of the collector region, and forming a collector by the back metal layer.

8. The method for manufacturing the super-junction IGBT device according to claim 7, wherein in Step 6, a bottom of the contact hole corresponding to the emitter penetrates through the source region; before an opening of the contact hole corresponding to the emitter is filled with metal, a body lead-out region is formed by a P+ region on the surface of the body region located at the bottom of the contact hole corresponding to the emitter; and the emitter is connected with the body region through the body lead-out region.

9. A super-junction insulated gated bipolar transistor (IGBT) device comprising:
a super-junction structure formed by a plurality of N-type pillars and P-type pillars which are alternately arrayed in a horizontal direction, and each N-type pillar and adjacent P-type pillar forming a corresponding super-junction cell, wherein the super-junction structure is formed in an N-type epitaxial layer, and a P-type doped collector region is formed at a bottom of the N-type epitaxial layer; and wherein bottoms of the P-type pillars are spaced from a top surface of the collector region; and
device cell structures formed at tops of the super-junction cells, and the multiple device cell structures are connected in parallel to form the super-junction IGBT device;
each of the device cell structure comprising:
a trench gate comprising a gate trench, a gate dielectric layer formed on a bottom surface and side faces of the gate trench, and a polysilicon gate filling the gate trench, wherein the gate trench extends across an interface of the corresponding P-type pillar and adjacent N-type pillar in the horizontal direction, a first side face of the gate trench is located in the corresponding P-type pillar, and a second side face of the gate trench is located in the corresponding adjacent N-type pillar;
a P-type doped body region formed at a top of the corresponding N-type pillar, wherein a depth of the gate trench is greater than that of the body region, and channels are formed on a surface of the body region and covered by side faces of the polysilicon gate; and
a source region formed on the surface of the body region by an N+ region;
wherein a drift region is formed by the N-type pillar at a bottom of the body region and by the N-type epitaxial layer at a bottom of the N-type pillar; and
wherein the top of each N-type pillar is provided with one body region and two gate trenches located on two sides of the body region, and each body region is isolated from the P-type pillars on two sides of the body region by the corresponding gate trenches.

10. The super-junction IGBT device according to claim 9, wherein the P-type pillars are formed by a P-type ion-implanted region formed in a selected area of the N-type epitaxial layer, particularly, the N-type epitaxial layer corresponding to the super-junction structure is formed by multiple times of epitaxial growth, and P-type ion implantation is conducted every time the N-type epitaxial layer epitaxially grows, so as to form one part of the P-type ion-implanted region corresponding to the P-type pillars; and
the N-type pillars are formed by the N-type epitaxial layer between the P-type pillars.

11. The super-junction IGBT device according to claim 9, wherein an N-type doped field stop layer is formed in the N-type epitaxial layer located on a front of the collector region, a doping concentration of the field stop layer is greater than that of the N-type epitaxial layer, and a top surface of the field stop layer is spaced from a bottom surface of the corresponding P-type pillar.

12. The super-junction IGBT device according to claim 9, wherein the P-type pillars are formed by a P-type epitaxial layer filled in super-junction trenches which are formed in the N-type epitaxial layer, and the N-type pillars are formed by the N-type epitaxial layer between the P-type pillars.

13. The super-junction IGBT device according to claim 9, wherein the gate dielectric layer is a gate oxide.

14. The super-junction IGBT device according to claim 9, wherein surfaces of the source region, the polysilicon gate and the body region are covered with an interlayer film;
contact holes penetrating through the interlayer film are separately formed in a top of the source region and in a top of the polysilicon gate;
a front metal layer is formed on a surface of the interlayer film and is patterned to form an emitter and a gate, the emitter makes contact with the source region at a bottom of the emitter via the corresponding contact hole, and the gate makes contact with the polysilicon gate at a bottom of the gate via the corresponding contact hole; and
a collector is formed on a bottom surface of the collector region by a back metal layer.

15. The super-junction IGBT device according to claim 14, wherein a bottom of the contact hole corresponding to the emitter penetrates through the source region, a body lead-out region is formed by a P+ region on the surface of the body region located at the bottom of the contact hole corresponding to the emitter, and the emitter is connected with the body region through the body lead-out region.

\* \* \* \* \*